United States Patent [19]
Zink

[11] Patent Number: 6,091,641
[45] Date of Patent: Jul. 18, 2000

[54] NON-VOLATILE MEMORY DEVICE AND METHOD FOR THE PROGRAMMING OF THE SAME

[75] Inventor: Sébastien Zink, Aix en Provence, France

[73] Assignee: STMicroelectronics S.A., Gentilly, France

[21] Appl. No.: 09/195,276

[22] Filed: Nov. 18, 1998

[30] Foreign Application Priority Data

Nov. 18, 1997 [FR] France .................................. 97 14686

[51] Int. Cl.⁷ .................................................. G11C 16/04
[52] U.S. Cl. ................................ 365/185.28; 365/185.29; 365/189.01
[58] Field of Search .......................... 365/185.28, 185.29, 365/201, 218, 189.01

[56] References Cited

U.S. PATENT DOCUMENTS

| | | | |
|---|---|---|---|
| 4,763,305 | 8/1988 | Kuo .......................................... | 365/200 |
| 5,644,530 | 7/1997 | Gaultier ............................... | 365/185.09 |
| 5,742,548 | 4/1998 | Bahout et al. ........................... | 365/201 |
| 5,890,193 | 3/1999 | Chevallier ............................... | 365/218 |

FOREIGN PATENT DOCUMENTS 0 403 822  12/1990  European Pat. Off. .

*Primary Examiner*—David Nelms
*Assistant Examiner*—David Lam
*Attorney, Agent, or Firm*—Theodore E. Galanthay; Fleit, Kain, Gibbons, Gutman & Bongini PL

[57] ABSTRACT

A method for performing a first programming operation on a non-volatile memory device of the type that is normally programmed by executing a pre-programming erasure algorithm and then a programming algorithm. According to the method, a non-volatile memory device is manufactured with all its memory cells in the same state, and the first programming operation for setting the memory cells to desired states is performed by executing only the programming algorithm. In a preferred method, the memory device is provided with two modes of operation: a first mode in which programming is accomplished by executing the pre-programming erasure algorithm and then the programming algorithm, and a second mode in which programming is accomplished by executing only the programming algorithm. In the preferred method, the memory device is placed in the second mode of operation before the first programming operation is performed. A non-volatile memory device having two modes of operation is also provided.

20 Claims, 1 Drawing Sheet

NON-VOLATILE MEMORY DEVICE AND METHOD FOR THE PROGRAMMING OF THE SAME

CROSS-REFERENCE TO RELATED APPLICATIONS

This application is based upon and claims priority from prior French Patent Application No. 97-14686, filed Nov. 18, 1997, the entire disclosure of which is herein incorporated by reference.

BACKGROUND OF THE INVENTION

1. Field of the Invention

The present invention relates to non-volatile semiconductor memory devices, and more specifically to electrically erasable and programmable non-volatile memory devices.

2. Description of the Related Art

Electrically erasable and programmable non-volatile memory devices (EEPROMs) offer great flexibility of use and are now one of the most widely used types of memory devices. Conventional EEPROM devices have two transistors for each memory cell (i.e., a selection transistor and a floating gate storage transistor), and each memory cell stores one bit of information. High capacity (e.g., 1 Mbit) EEPROMs have been developed to be used in applications that require a large amount of memory. Typically, such EEPROMs are delivered to the customer in a known state, such as with all memory cells placed in the erased state. Later, the customer writes the required application-specific data to the memory devices on the production line.

In particular, two successive cycles are used for the first programming of an EEPROM device. An erasure cycle sets all of the memory cells of a selected word to "1" and then a programming cycle sets selected memory cells of the word to "0". For example, if the data word to be written is "10101100", then the eight memory cells of the word are first erased to the "1" state and then the second, fourth, seventh, and eighth bits are programmed to the "0" state. Thus, the first programming operation for a conventional EEPROM device has a relatively long duration that increases proportionally with the capacity of the memory.

Previously, attempts at reducing the duration of the first programming operation have focused on reducing the time required to program or erase a memory cell or on increasing the size of a page whose memory cells can be written simultaneously. For example, the time that the programming or erasure voltage is applied can be reduced in order to reduce the duration of the programming or erasing cycle. However, the voltage application period must be long enough to prevent a decrease in the information retention time of the memory cell. Additionally, the voltage level applied to the memory cell can be increased in order to reduce the duration of the programming or erasing cycle. However, the application of a higher voltage increases the risk of causing stress on the gate oxide of the memory cell. Thus, the physical characteristics of conventional EEPROM devices dictate a minimum programming cycle time and a maximum programming voltage level.

Similarly, while the duration of the first programming operation can also be reduced by increasing the page size, eventually the increased page size causes the load pump that produces the high programming voltage to be incapable of providing a sufficient voltage. More specifically, the increasing of the page size causes the capacitive load connected to the output of the load pump to be increased so it becomes necessary to increase the fan-out of the load pump. Additionally, the increasing of the page size makes it necessary to increase both the number of bit lines and the number of programming circuits in order to allow more memory cells to be programmed in parallel. Therefore, increasing the page size results in increased manufacturing cost for the device.

SUMMARY OF THE INVENTION

In view of these drawbacks, it is an object of the present invention to remove the above-mentioned drawbacks and to provide a non-volatile memory device in which the duration of the first programming operation is reduced without increasing the cost of manufacturing the device. The memory device is manufactured with all of the memory cells in the same erased state, and then for the first programming operation only a programming algorithm must be performed. In other words, the customer does not have to first perform a pre-programming erasure algorithm before the programming algorithm during the first programming operation for the memory device. Thus, the time required for the first programming operation of the memory device is greatly reduced.

One embodiment of the present invention provides a non-volatile memory device that includes a matrix of memory cells, a writing circuit, and a control circuit The writing circuit writes data to memory cells by selectively applying programming and erasing voltages to memory cells that are selected by addressing circuitry. The control circuit controls the writing circuit so as to perform the programming operation for the selected memory cells. The control circuit can direct a first pre-programming erasure algorithm, which causes the writing circuit to apply an erasure voltage to the selected memory cells, and a second programming algorithm, which causes the writing circuit to apply a programming voltage to the selected memory cells. Further, the memory device has two modes of operation: a normal mode in which programming is accomplished by performing the first pre-programming algorithm and then the second programming algorithm, and an initialization mode in which programming is accomplished by performing only the second programming algorithm. The initialization mode is particularly suited for use in the first programming operation of a memory device that comes from the manufacturer with all memory cells in the same state (i.e., an "erased" state). Thus, the memory device enables the first programming operation to be accomplished by performing only the second programming algorithm. In one preferred embodiment, the initialization mode is activated by a low voltage external command. The present invention also provides a method for performing the first programming operation on a non-volatile memory device.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
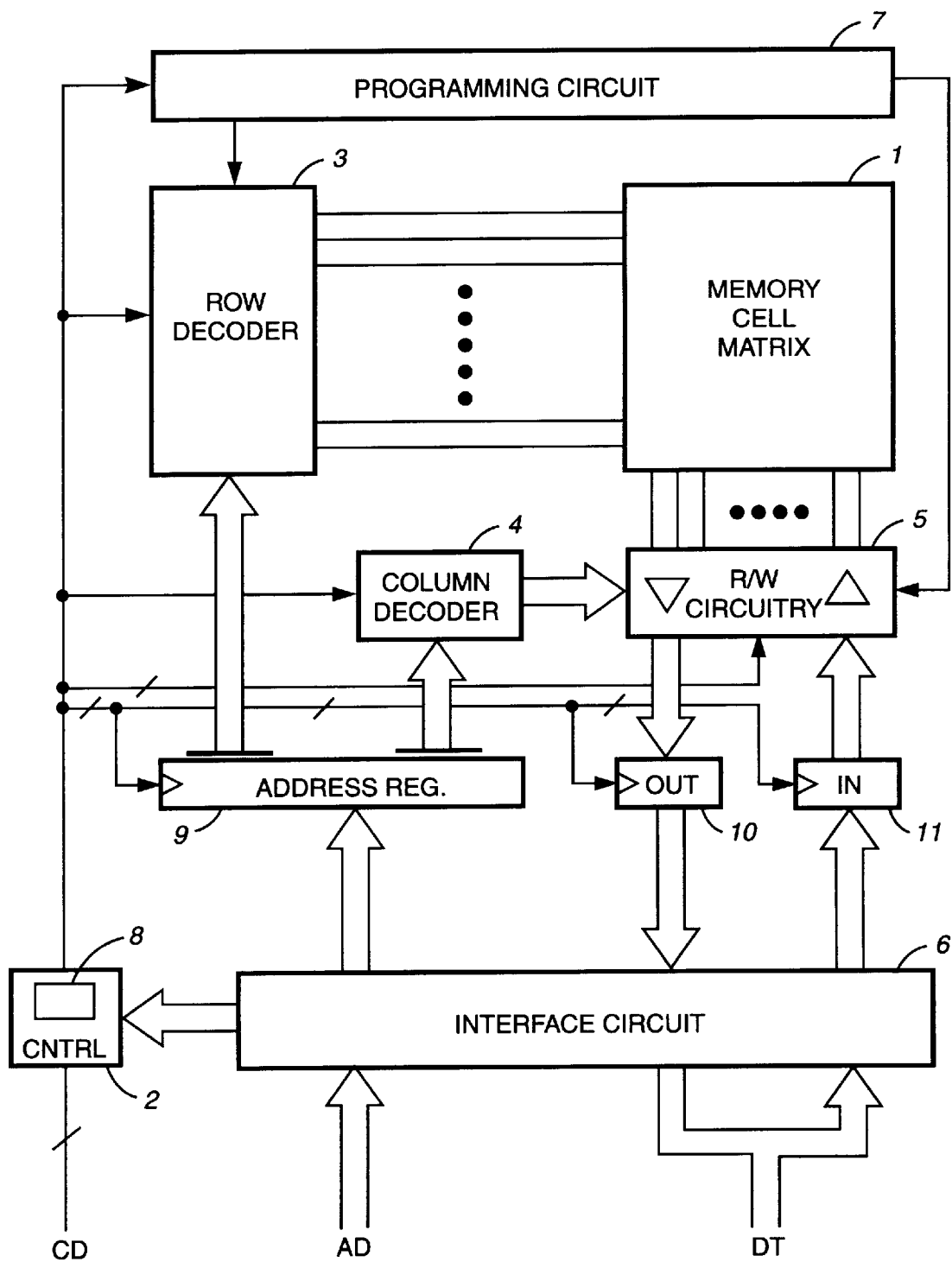
FIG. 1 is a block diagram showing the structure of an EEPROM device according to an embodiment of the present invention.

Preferred embodiments of the present invention will be described in detail hereinbelow with reference to the attached drawing. In the following description, the logic state "1" is used to designate an erased memory cell (i.e., a cell whose floating gate is charged with electrons), and the logic state "0" is used to designate a programmed memory cell (i.e., a cell whose floating gate is depleted of electrons).

An electrically erasable and programmable non-volatile memory device (EEPROM) according to an embodiment of the present invention is shown in FIG. 1. A row decoder 3 is connected to a matrix of memory cells 1, and a column decoder 4 is coupled to the matrix through read and write circuits 5. The memory cells of the matrix 1 are written to using a programming circuit 7 that includes an oscillator, a voltage boost circuit, and a ramp generator. An address register 9 is connected to the row and column decoders 3 and 4, an output data register 10 is connected to the read portion of the read and write circuits 5, and an input data register 11 is connected to the write portion of the read and write circuits 5.

The address register 9, the output register 10, and the input register 11 communicate with external data lines DT and address lines AD through an interface circuit 6. The interface unit 6 is controlled by a control circuit 2 that receives external control signals CD. In this embodiment, the control circuit 2 is realized using a programmable logic array (PLA) that provides control signals to the components forming the memory as a function of the external control signals CD. In other words, the PLA forms a state machine for performing the algorithms necessary to control the operation of the memory.

When the EEPROM device of FIG. 1 is ordered, the customer must inform the device manufacturer of whether the device should be initially erased to the all "0" or all "1" state. The EEPROM device is delivered to the customer in the desired state, and the first programming operation performed by the customer only requires the execution of a programming algorithm. In other words, the customer does not have to perform a pre-programming erasure algorithm. Thus, the time required for the first programming operation of the memory device is halved as compared with the conventional first programing operation.

To allow for such operation, the EEPROM device of the present invention is designed to operate in two modes: a normal mode and an initializtion mode. In the normal mode, the programming of the memory is performed in two successive steps: a pre-programming erasure algorithm and a programming algorithm. For example, to write the data word "10101100", an erase operation is performed during a first cycle to set all of the memory cells of the word to "1", and then a programming operation is performed during a second cycle to set the second, fourth, seventh, and eighth memory cells to "0".

On the other hand, when the device is in the initialization mode, only the second cycle described above is performed to program the memory cells. In other words, the programming operation is activated during the first cycle of programming the memory. In order to provide the initialization mode of operation, the control circuit 2 of the EEPROM device includes an added detection circuit 8 that detects external signals for activating and deactivating the initialization mode. When the activation signal sequence is present at the inputs of the device, the detection circuit 8 outputs information to the control circuit 2 in order to place the device in the initialization mode. Then, all of the programming operations requested by the user are limited to the performance of the programming algorithm as described above. Later, the initialization mode is deactivated when a deactivation signal sequence is received.

In further embodiments, the activation and deactivation of the initialization mode is accomplished by applying a high voltage signal to the control bus. However, such embodiments require additional equipment (i.e., in addition to the programmer) for producing the necessary signal.

According to embodiments of the present invention, a non-volatile memory device is manufactured with all memory cells in the same state, and then for the first programming operation only a programming algorithm needs to be performed. Thus, the duration of the first programming operation for the memory device is greatly reduced. The resulting time reduction is even greater for high capacity memory devices.

While there has been illustrated and described what are presently considered to be the preferred embodiments of the present invention, it will be understood by those skilled in the art that various other modifications may be made, and equivalents may be substituted, without departing from the true scope of the invention Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A method for performing a first programming operation on a non-volatile memory device to store initial data, the memory device being of the type that is normally programmed by first executing a pre-programming erasure algorithm and then executing a programming algorithm to store data, said method comprising the steps of:

manufacturing the memory device such that all memory cells of the memory device are in one state; and performing the first programming operation to store the initial data in the memory cells by executing only the programming algorithm, wherein the step of performing the first programming operation includes the sub-step of receiving the initial data from an external source.

2. The method as defined in claim 1, further comprising the step of:

providing the memory device with first and second modes of operation, the first mode being one in which memory cell programming is accomplished by executing the pre-programming erasure algorithm and then the programming algorithm, and the second mode being one in which memory cell programming is accomplished by executing only the programming algorithm, wherein the step of performing the first programming operation also includes the sub-step, of placing the memory device in the second mode of operation.

3. The method as defined in claim 2, further comprising the step of switching the memory device between the first mode and the second mode on the basis of at least one external control signal.

4. The method as defined in claim 3, wherein the programming algorithm includes the step of applying programming voltages to the memory cells that are selected by addressing circuitry.

5. The method as defined in claim 1, wherein the programming algorithm includes the step of applying programming voltages to the memory cells that are selected by addressing circuitry.

6. The method as defined in claim 1, further comprising the step of:

supplying the memory device to a customer with all memory cells in the one state, wherein the customer performs the step of performing the first programming operation.

7. The method as defined in claim 1, wherein the one state is the logic "0" state.

8. The method as defined in claim 1, wherein the one state is the logic "1" state.

9. The method as defined in claim 1, wherein the memory device is electrically erasable and programmable.

10. A non-volatile memory device comprising:

a matrix of memory cells;

a writing circuit that writes data to the memory cells by selectively applying programming and erasure voltages to selected memory cells; and a control circuit that controls the writing circuit, wherein in a normal mode, the control circuit operates to store externally-provided data in the memory device by first executing a pre-programming erasure algorithm in which the erasure voltages are applied to selected memory cells and then executing a programming algorithm in which the programming voltages are applied to the selected memory cells, and in an initialization mode, the control circuit operates to store externally-provided data in the memory device by executing only the programming algorithm.

11. The non-volatile memory device as defined in claim 10, wherein the initialization mode is used for a first programming operation for storing initial data in the memory device.

12. The non-volatile memory device as defined in claim 11, wherein the memory device is manufactured with all memory cells in one state so that the initialization mode can be used for the first programming operation.

13. The non-volatile memory device as defined in claim 12, wherein the one state is the logic "0" state.

14. The non-volatile memory device as defined in claim 12, wherein the one state is the logic "1" state.

15. The non-volatile memory device as defined in claim 10, wherein the memory device is supplied to a customer with all memory cells in the one state, and the customer performs a first programming operation of the memory device using the initialization mode.

16. The non-volatile memory device as defined in claim 10, further comprising addressing circuitry for identifying the selected memory cells.

17. The non-volatile memory device as defined in claim 10, wherein the memory device is electrically erasable and programmable.

18. The non-volatile memory device as defined in claim 10, further comprising:

an external address input coupled to the matrix of memory cells, wherein in the initialization mode, external addresses provided at the external address input are used in the programming of the memory device.

19. A non-volatile memory device comprising:

a matrix of memory cells;

a writing circuit that writes data to the memory cells by selectively applying programming and erasure voltages to selected memory cells; and a control circuit that controls the writing circuit, wherein in a normal mode, the control circuit operates to program the memory device by executing a pre-programming erasure algorithm in which the erasure voltages are applied to selected memory cells and then executing a programming algorithm in which the programming voltages are applied to the selected memory cells, in an initialization mode, the control circuit operates to program the memory device by executing only the programming algorithm, the control circuit includes a detection circuit that monitors at least one external control signal and outputs a mode signal based on the external control signal, and the control circuit places the memory device in either the normal mode or the initialization mode based on the output of the detection circuit.

20. The non-volatile memory device as defined in claim 19, wherein the initialization mode is activated by supplying a low voltage command to the memory device.

* * * * *